United States Patent
Peters et al.

(10) Patent No.: US 6,204,135 B1
(45) Date of Patent: Mar. 20, 2001

(54) METHOD FOR PATTERNING SEMICONDUCTORS WITH HIGH PRECISION, GOOD HOMOGENEITY AND REPRODUCIBILITY

(75) Inventors: Dethard Peters, Höchstadt; Reinhold Schörner, Grossenseebach, both of (DE)

(73) Assignee: SICED Electronics Development GmbH & Co KG, Erlangen (DE)

( * ) Notice: Subject to any disclaimer, the term of this patent is extended or adjusted under 35 U.S.C. 154(b) by 0 days.

(21) Appl. No.: 09/494,782

(22) Filed: Jan. 31, 2000

Related U.S. Application Data

(63) Continuation of application No. PCT/DE98/02110, filed on Jul. 27, 1998.

(30) Foreign Application Priority Data

Jul. 31, 1997 (DE) .............................. 197 33 068

(51) Int. Cl.$^7$ ...................... H01L 21/336; H01L 21/331; H01L 21/302
(52) U.S. Cl. .................. 438/301; 438/739; 438/305; 438/306
(58) Field of Search .................. 438/305, 268, 438/299, 301, 306, 739

(56) References Cited

U.S. PATENT DOCUMENTS

| | | | |
|---|---|---|---|
| 4,430,792 | * 2/1984 | Temple | 29/571 |
| 4,430,793 | 2/1984 | Temple . | |
| 5,227,321 | 7/1993 | Lee et al. . | |
| 5,648,283 | 7/1997 | Tsang et al. . | |
| 5,731,604 | * 3/1998 | Kinzer | 257/153 |
| 5,869,379 | * 2/1999 | Gardner et al. | 438/305 |
| 5,989,967 | * 11/1999 | Gardner et al. | 438/305 |

FOREIGN PATENT DOCUMENTS

0252179A1 1/1988 (EP) .
0589631A1 3/1994 (EP) .

OTHER PUBLICATIONS

"Design and Characteristics of Lightly Doped Drain–Source (LDD) Insulated Gate Field–Effect Transistor", Seiki Oruga et al., IEEE TRansactions on Electron Devices, vol. ED–27, No. 8, Aug. 1980, pp. 1359–1367.*

Japanese Patent Abstract No. 2–30122 (Suzuki), dated Jan. 31, 1990.*

"Device Structures and Technology", B.J. Baliga, Modern Power Devices, Krieger Publishing Company, 1992 pp. 331–336.

"Self–aligned 6H–SiC MOSFETs with improved current drive", J.N. Pan et al., Electronics Letters, Jul. 1995, vol. 31, pp. 1200–1201.

"4H–silicon carbide power switching devices", J.W. Palmour et al., Technical digest of International Conference on SiC and related material, Kyoto, 1995, pp. 319–322.

"A low loss/highly rugged IGBT–generation—based on a self aligned process with double implanted N/N$^+$–emitter", T. Laska et al., Proc. of the 6$^{th}$ international symposium on power semiconductor devices & Ics, Davos, 1994, pp. 171–175.

* cited by examiner

Primary Examiner—John F. Niebling
Assistant Examiner—Viktor Simkovic
(74) Attorney, Agent, or Firm—Herbert L. Lerner; Laurence A. Greenberg; Werner H. Stemer

(57) ABSTRACT

A thin-film system is deposited onto a surface of a semiconductor region. After at least one window has been opened in the thin-film system, the window serves as a mask for a first selective processing of a first semiconductor partial region. By undercutting the thin-film system, the edge of the window is drawn back approximately uniformly by a mean undercutting depth. The at least one enlarged window serves as a mask for a second selective processing of a second semiconductor partial region. A semiconductor structure is also provided.

19 Claims, 8 Drawing Sheets

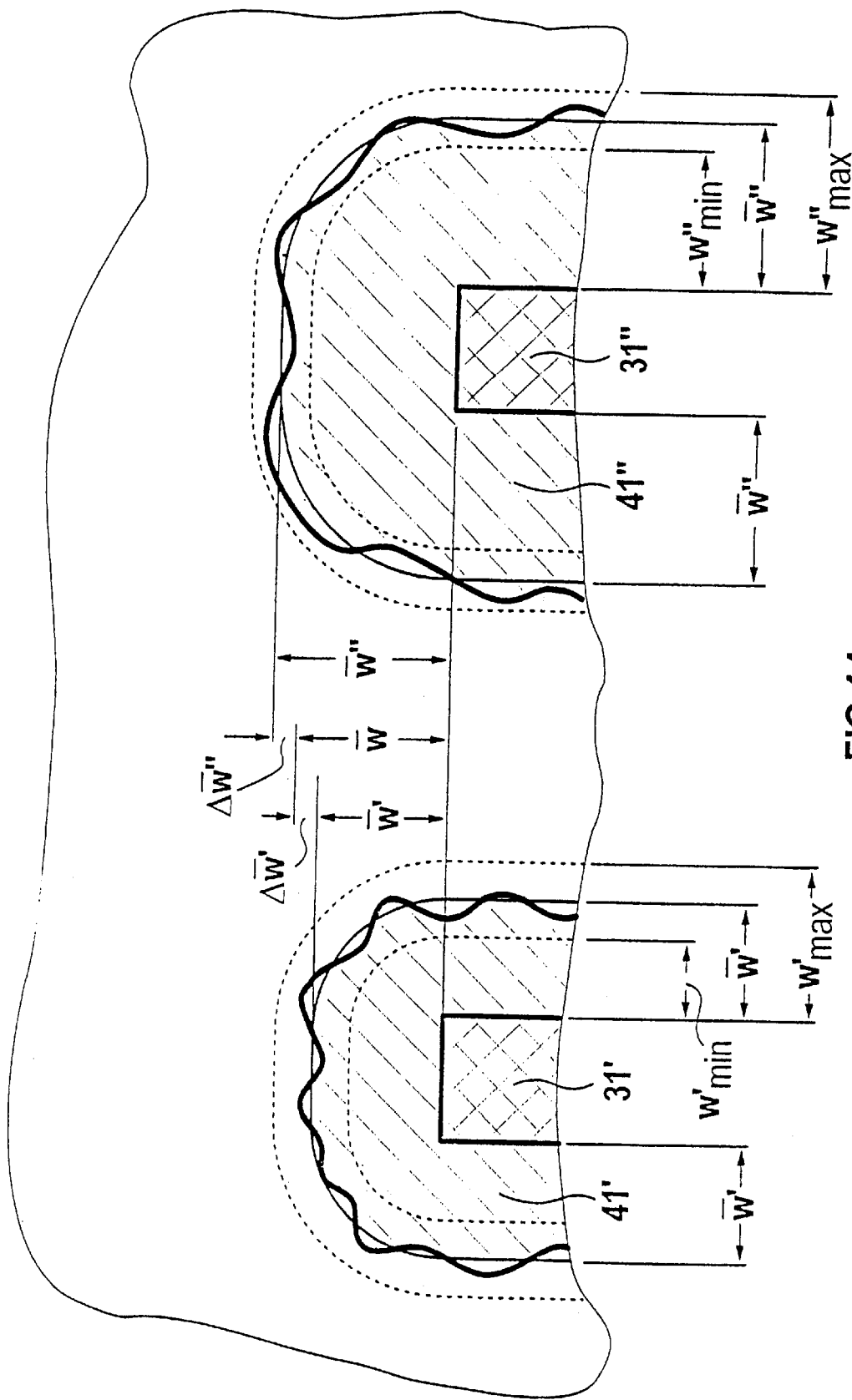

METHOD FOR PATTERNING SEMICONDUCTORS WITH HIGH PRECISION, GOOD HOMOGENEITY AND REPRODUCIBILITY

CROSS-REFERENCE TO RELATED APPLICATION

This application is a continuation of copending International Application PCT/DE98/02110, filed Jul. 27, 1998, which designated the United States.

BACKGROUND OF THE INVENTION

Field of the Invention

The invention relates to a method for fabricating semiconductor structures, in particular made of silicon carbide. The invention furthermore relates to a correspondingly fabricated semiconductor structure.

In the case of power semiconductor components, e.g. power MOSFETs (Metal-Oxide-Semiconductor Field Effect Transistor), particularly high requirements are made of the homogeneity, because many parts, referred to as cells, of these components are often connected in parallel and each cell should contribute the same proportion to a total current.

In the case of a vertical MOSFET cell with a so-called lateral channel region, which is known per se in the field of silicon technology, a so-called channel length is defined by the lateral overlap of a base region over a source region of the MOSFET with opposite conductivity types. In order to obtain a relatively low channel resistance, it has been tried to minimize the channel length of the MOSFET cell. Furthermore, mass production of components having at least approximately identical properties requires that the channel length is at least largely homogeneous across the entire wafer made of the semiconductor material and can be set in a reproducible manner from wafer to wafer.

A self-aligning method for fabricating vertical MOSFET components in silicon is disclosed in the book by "B. J. Baliga", *Modern Power Devices*, Krieger, Publishing Comp., 1992, pages 331–336. In the method described for the fabrication of a DMOS-FET (double-diffused MOSFET), first of all a MOS system (gate oxide and gate electrode) is prepared on a silicon layer of the n-conducting type, the silicon layer being produced by epitaxy. The MOS system is patterned photolithographically in the desired manner and forms a mask having defined cell windows for the subsequent implantation of boron ions. Afterwards, an auxiliary masking is applied, which, in each case in the center of the cell windows, masks a portion of the previously implanted p-doped base regions and thus keeps them accessible from the surface of the semiconductor structure. The mask system modified in this way serves as a mask for a further implantation step (usually with arsenic), which defines the n-doped source regions of the structure. The channel length of the structure results from the different diffusion coefficients of the slow donor and of the fast acceptor. The channel length can be set in a self-aligning manner by way of the temperature and duration of the annealing process. The MOS system is detrimentally affected only insignificantly, or not at all, by this high-temperature step. After the thermal annealing of the implanted dopants, an insulating oxide layer is applied to the structure. Contact windows are opened photolithographically in the oxide layer, in a manner aligned with the auxiliary masking. Finally, the surface is metalized. This method is noncritical with regard to the setting of the channel length. It requires just two relatively noncritical alignment steps in the case of the application of the auxiliary masking and the opening of the contact windows, but cannot be applied to semiconductors in which practically no diffusion takes place, such as e.g. SiC or diamond.

A method for fabricating a lateral MOSFET in silicon carbide of the 6H crystal type (6H—SiC) is described in the article "Self aligned 6H—SiC MOSFETs with improved current drive", J. N. Pan, J. A. Cooper, M. R. Melloch, *Electronics letters*, Jul. 6, 1995, Vol. 31, No. 14, pp. 1200–1201. In accordance with this method, adjacent windows in a mask plane define, within an epitaxially grown, p-doped 6H—SiC layer, in pairs, source and drain regions of a standard cell which are n-doped in each case through the use of the implantation of nitrogen ions.

However, since considerably higher temperatures (1200° C.–1500° C.) are necessary for SiC, in comparison with silicon (750° C.–800° C.), for annealing and activating the implanted dopants, the use of the MOS system as masking is problematic. In order not to damage the MOS system, a heat treatment can be effected only at temperatures of up to a maximum of 1200° C. Moreover, the diffusion in SiC is negligibly small, with the result that there is no self-aligning control by way of a channel length in a manner corresponding to the silicon method. Consequently, implantation of acceptor ions is not possible. The channel length is set by way of the spacing of the windows in the mask, and the gate oxide and the gate electrode lie in a self-aligned manner above the inversion channel. The method cannot be applied to those types of components in which a channel region is implanted, because for this purpose p-type doping is necessary either for the source and drain or for the channel region. The maximum possible annealing temperature of 1200° C. does not suffice, however, for annealing the lattice damage and activating the acceptor ions.

The fabrication of a nonplanar UMOS structure is described in the article "4H-Silicon Carbide Power Switching Devices" J. W. Palmour et al., *Technical digest of International conference on SiC and related material*, Kyoto, 1995, pp. 319–322. The source regions are defined by the implantation of donor ions into an epitaxially grown p-doped SiC layer. Through the use of reactive ion etching (RIE), aligned in each case with the center of the source regions, a U-shaped trench is opened in the surface of the semiconductor structure. The trenches in each case reach down into the n-doped SiC layer disposed under the p-doped SiC layer and accommodate gate oxide and gate electrode. The channel length is defined by the thickness of the p-doped SiC layer which remains in the vertical direction between the source region and the n-doped SiC layer. only a single implantation step is provided in this method as well. The channel length is controlled by way of the penetration depth of the nitrogen ions and the thickness of the p-doped SiC layer. A laterally disposed channel region cannot be realized by this method.

A further method for the self-aligned fabrication of a semiconductor structure in silicon with two implantation steps is presented in the article "A low loss/highly rugged IGBT-Generation—based on a self aligned process with double implanted n/n$^+$-Emitter", *Proc. of the 6$^{th}$ international Symposium on power semiconductor devices & ICs*, Davos, 1994, pages 171–175. The method is distinguished by the fact that after an implantation step, a spacer technique which is known in the silicon technology is employed. In a CVD process, the windows that have been previously etched into the mask plane are reduced in size, from their edge, uniformly by a defined amount of between 0.4 μm and 0.6

μm. With these windows that have been reduced in size, it is then possible, in a subsequent implantation step, to produce further semiconductor regions which are all precisely self-aligned, down to 0.3 μm, with regard to respective semiconductor regions produced by the first implantation step. This described method has the disadvantage that it cannot be applied a number of times in succession, and the spacer technique allows the windows to be reduced in size only up to a maximum of 1 μm. Moreover, deposition methods and a removal of the auxiliary layers are time-consuming and cost-intensive.

SUMMARY OF THE INVENTION

It is accordingly an object of the invention to provide a self-aligning method for patterning semiconductors which overcomes the above-mentioned disadvantages of the heretofore-known methods of this general type and through the use of which, in a semiconductor configuration, the spatial configuration of at least two different semiconductor partial regions with different electronic properties can be set with a precision, homogeneity, and reproducibility which are at least comparable to those of the prior art, and which, in addition to being suitable for silicon, is also suitable for further semiconductor materials, in particular silicon carbide.

With the foregoing and other objects in view there is provided, in accordance with the invention, a method for fabricating semiconductor structures, which includes the steps of:

a) depositing a thin-film system onto a surface of a semiconductor region, the thin-film system being preferably a masking material and including a partial layer formed of an oxide material and directly adjoining the surface of the semiconductor region;

b) etching at least one window into the thin-film system with an etching method, the window extending to the surface of the semiconductor region and being advantageously used as a mask;

c) using the at least one window in the thin-film system for a first selective processing of a partial region of the semiconductor region;

d) using an undercutting process for enlarging the window by moving back, in the partial layer, an edge of the window approximately uniformly by an amount corresponding to a mean undercutting depth in a plane of the partial layer; and e) subsequently utilizing the thus enlarged window for a second selective processing of a further partial region of the semiconductor region.

The invention is based on the insight that in the case of the selection of method steps according to the invention, all the regions of the semiconductor structure which are intended to be subjected to a selective processing are aligned relative to one another through the use of a single mask plane. In this sense, the method can be called a self-aligning method. What is essential to the method is an undercutting process which enables windows in the thin-film system to be drawn back in each case approximately uniformly by an amount in the layer plane. An alignment with the windows originally defined in the mask plane is necessary only when the semiconductor regions are contact-connected using metal contacts and when additional oxide layers and/or gate electrodes are applied.

In accordance with a first advantageous mode of the method of the invention, a second selective processing of the semiconductor region is followed, at least once, by a sequence of method steps which include at least the method steps of the undercutting of the thin-film system and the selective processing of the semiconductor region.

In accordance with a further advantageous mode of the invention, the thin-film system includes at least a first and a second thin film, where the two thin films are deposited successively onto the surface of the semiconductor region to be patterned and, due to their material properties, can be etched selectively both relative to one another and with respect to the semiconductor material. In the course of the undercutting process according to the invention, the thin-film system is thus removed uniformly in the layer plane of a first layer.

In accordance with another mode of the invention, the undercutting is performed by wet-chemical etching using for example hydrofluoric acid (BHF) as an etchant. A predetermined desired value of the undercutting depth can then be set by way of the etching duration.

In accordance with yet another mode of the invention, an oxide material is provided at least for parts of the thin-film system. Silicon dioxide ($SiO_2$) is preferably used as the oxide material; however, other oxides or nitrides are also conceivable, such as, for instance, $Ti_2O_3$, $SiO$, $Ta_2O_5$, $Si_3N_4$, or else other materials which can be etched selectively. If the semiconductor material at least partly contains silicon (atoms) (Si, SiC), an $SiO_2$ layer can advantageously be fabricated in a simple manner, for example by one of the known methods for the thermal oxidation of a semiconductor surface. A second or else further layer of the thin-film system is typically composed of polysilicon or low-stress $Si_3N_4$.

In accordance with an advantageous mode of the invention, buffered hydrofluoric acid (BHF) is used as a wet-chemical etchant. The undercutting depth can then be controlled very precisely, since the etching rate of BHF for $SiO_2$ is for example 70 nm/min, and the etchant effects good wetting of the surfaces to be etched.

In accordance with an additional mode of the invention, an etching method is used for the opening of the at least one window in the thin-film system, wherein the removal is effected essentially in a preferred direction or orientation which is at a defined angle of inclination with respect to a direction perpendicular to the surface.

In accordance with an added mode of the invention, an additional method step is provided, wherein in the areas, which are defined by the windows in the thin-film system, optically identifiable etching edges, which are resistant to the annealing of the semiconductor structure, are additionally etched into the surface of the semiconductor.

In accordance with an additional mode of the invention, prior to each selective processing of a partial region of the semiconductor region, a screen layer or scattering layer is applied at least to parts of the surface of the semiconductor region. $SiO_2$ is preferably used for the screen layer.

In accordance with an another mode of the invention, the mean undercutting depth is an arithmetic mean value formed from a minimum undercutting depth and a maximum undercutting depth; and the window has an actual undercutting depth having a deviation from the mean undercutting depth. The deviation from the mean undercutting depth is smaller than a given value predetermined jointly for a plurality of windows.

In accordance with yet another mode of the invention, a mean value for a plurality of windows is maintained. The mean value for the plurality of windows corresponds to an arithmetic mean value formed from mean undercutting depths of the plurality of windows. The deviations of the mean undercutting depths from the mean value for the plurality of windows is kept below a given value. The deviation of the mean value for the plurality of windows from a desired value is preferably kept smaller than or equal to an alignment tolerance.

In accordance with a further mode of the invention, by setting an undercutting depth in the thin-film system, it is possible to perform in each case two successive processing operations on the semiconductor region to be patterned, with a defined precision, homogeneity and reproducibility, wherein the successive processing operations are centered with respect to one another. The precision of an undercutting operation is then preferably provided such that the relative inaccuracy of the actual undercutting depth (deviation of an actual undercutting depth from a mean value of the undercutting depth in a window) is less than 10 nm.

In accordance with another mode of the invention, the homogeneity of an undercutting operation is provided such that the relative inaccuracy of the mean undercutting depth (deviation of the respective mean value of the undercutting depth from a mean value of the mean undercutting depth, the mean value being common to all of the windows) is less than 10 nm. In accordance with an advantageous mode of the invention, the reproducibility of an undercutting operation is provided such that the effective undercutting depth (deviation of the mean value, common to all of the windows, of the mean undercutting depth from a predetermined value) is less than 100 nm.

With the objects of the invention in view there is also provided, a semiconductor structure with a semiconductor material including a semiconductor region having a surface, a first partial region, and a second partial region; a thin-film system disposed on the surface of the semiconductor region, the thin-film system including a partial layer formed of an oxide material directly adjoining the surface of the semiconductor region; the thin-film system being formed with a window extending to the surface of the semiconductor region for allowing the first partial region to be processed by a first selective processing; and the thin film system being formed with an undercut in the partial layer for allowing the second partial region to be processed by a second selective processing.

Other features which are considered as characteristic for the invention are set forth in the appended claims.

Although the invention is illustrated and described herein as embodied in a method for patterning semiconductors with high precision, good homogeneity and reproducibility, and a corresponding semiconductor structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 4 to 6 are diagrammatic cross-sectional views of the semiconductor structure illustrating the additional method steps for the optional application of alignment markers in the areas masked by the thin-film system;

FIG. 7 is a diagrammatic cross-sectional view of the semiconductor structure illustrating the etching of a window into the thin-film system;

FIG. 8 is a diagrammatic cross-sectional view of the semiconductor structure illustrating a first selective processing of a first semiconductor partial region masked by a window;

FIG. 9 is a diagrammatic cross-sectional view of the semiconductor structure illustrating the step of drawing back of parts of the thin-film system through the use of an undercutting process;

FIG. 10 is a diagrammatic cross-sectional view of the semiconductor structure illustrating a second selective processing of a second semiconductor partial region, which is masked by a window that has been enlarged through the use of an undercutting process;

FIG. 11 is a diagrammatic cross-sectional view of the semiconductor structure illustrating, as an optional step, a renewed drawing back of parts of the thin-film system through the use of an undercutting process;

FIG. 12 is a diagrammatic cross-sectional view of the semiconductor structure illustrating, as an optional step, a further selective processing of a third semiconductor partial region, which is masked by a window that has been further enlarged through the use of a renewed undercutting process; and FIGS. 13 and 14 are fragmentary plan views of the surface of a semiconductor region, illustrating the windows in the thin-film system which are used for the method according to the invention.

DESCRIPTION OF THE PREFERRED EMBODIMENTS

Figure 1:
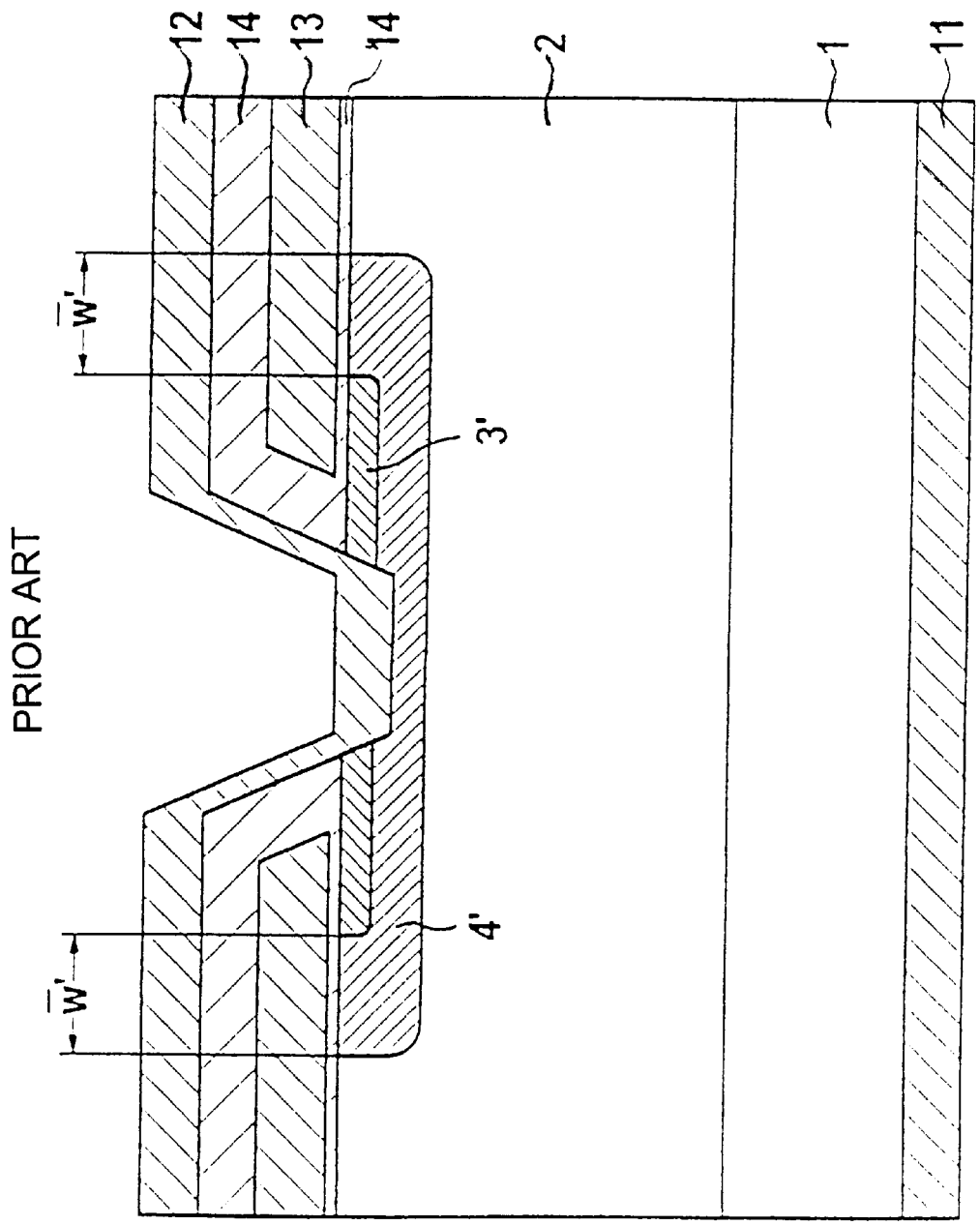
FIG. 1 is a cross-sectional view of a MOSFET semiconductor structure which is known per se in the silicon technology.

Referring now to the figures of the drawings in detail and first, particularly, to FIG. 1 thereof, there is shown a semiconductor structure, known per se in the silicon technology, of a vertical MOSFET with a lateral channel region. Corresponding features are indicated with the same reference numerals in the drawings. The contact-connection or contacting of a first semiconductor partial region 3', which forms a source region, and of a second semiconductor partial region 4', which forms a base region, is realized through the use of a V-shaped source metalization layer 12, which is led through the first semiconductor partial region 3' into the second semiconductor partial region 4'. The active region of the component shown is situated in that area of the second semiconductor partial region 4' which is near the surface. The lateral overhang of the second semiconductor partial region 4' to each side beyond the first semiconductor partial region 3' defines a channel length corresponding to a mean undercutting depth $\overline{w}'$. In FIG. 1, furthermore, the substrate is designated by reference numeral 1, a further semiconductor region is designated by reference numeral 2, the drain electrode is designated by reference numeral 11, the gate electrode is designated by reference numeral 13 and the gate insulator is designated by reference numeral 14.

Figure 2:
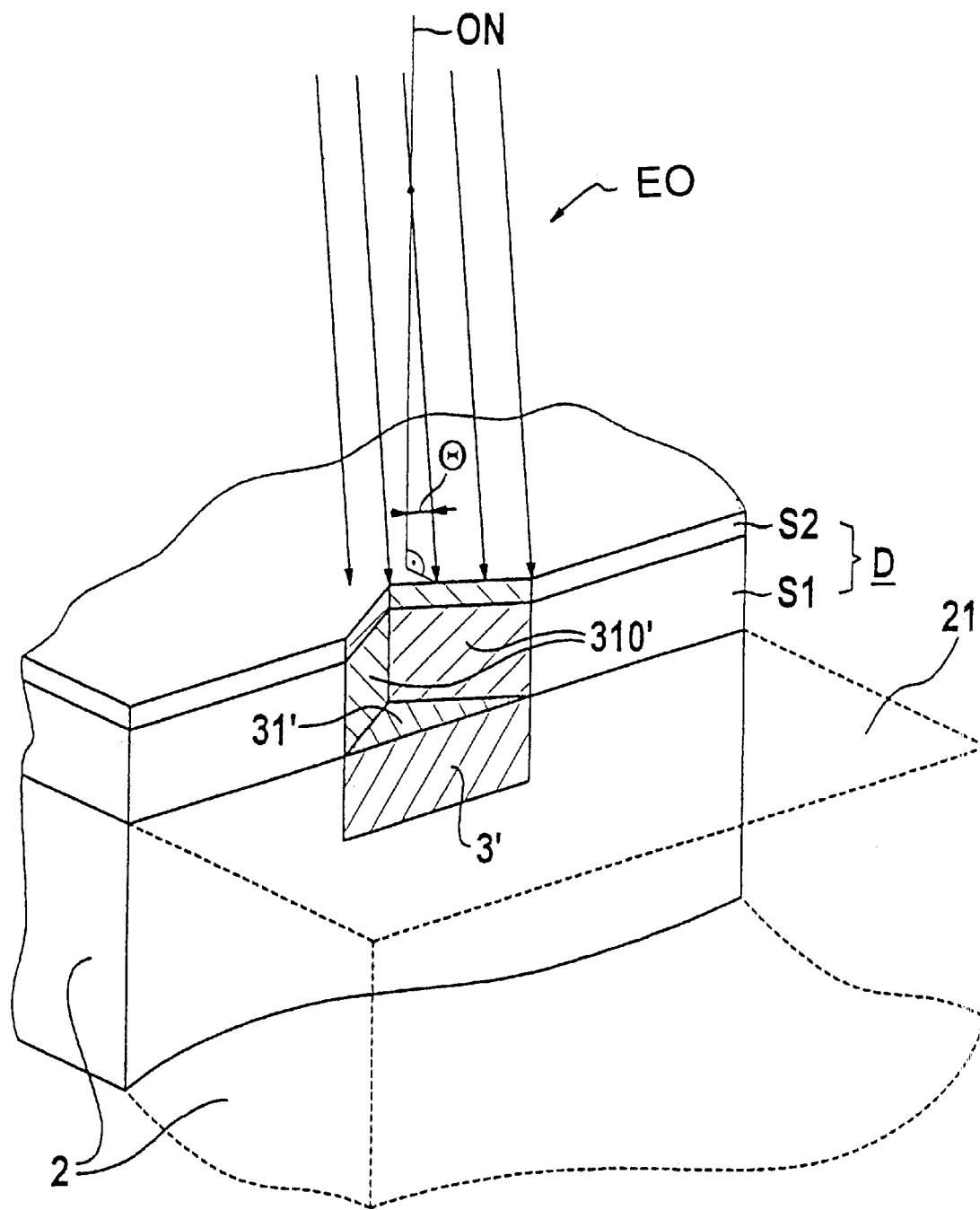
FIG. 2 is a partial, perspective view of a cross section through a semiconductor structure that has been processed by a method according to the invention, illustrating the process of opening the windows in the thin-film system according to the invention.

In FIG. 2, the thin-film system D, which is composed of a single or preferably of two layers S1 and S2 made of at least one masking material, is situated on the surface 21 of a semiconductor region 2. At least one window 31' is etched into the thin-film system D through the use of an etching operation, which is indicated by the five parallel arrows EO and whose preferred direction includes a defined angle θ of inclination with the normal ON to the surface 21 of the semiconductor region 2. The at least one window 31' has, within the thin-film system, an inner area 310' indicated by hatching. The one window 31' is used as a masking for a selective processing of a first partial region 3' of the semiconductor region 2. Through the use of an undercutting process according to the invention, at least one partial layer of the thin-film system D is then drawn back approximately uniformly in the layer plane. In this case, the undercutting process attacks the inner area 310' of the window 31' in the thin-film system D.

Figure 3:
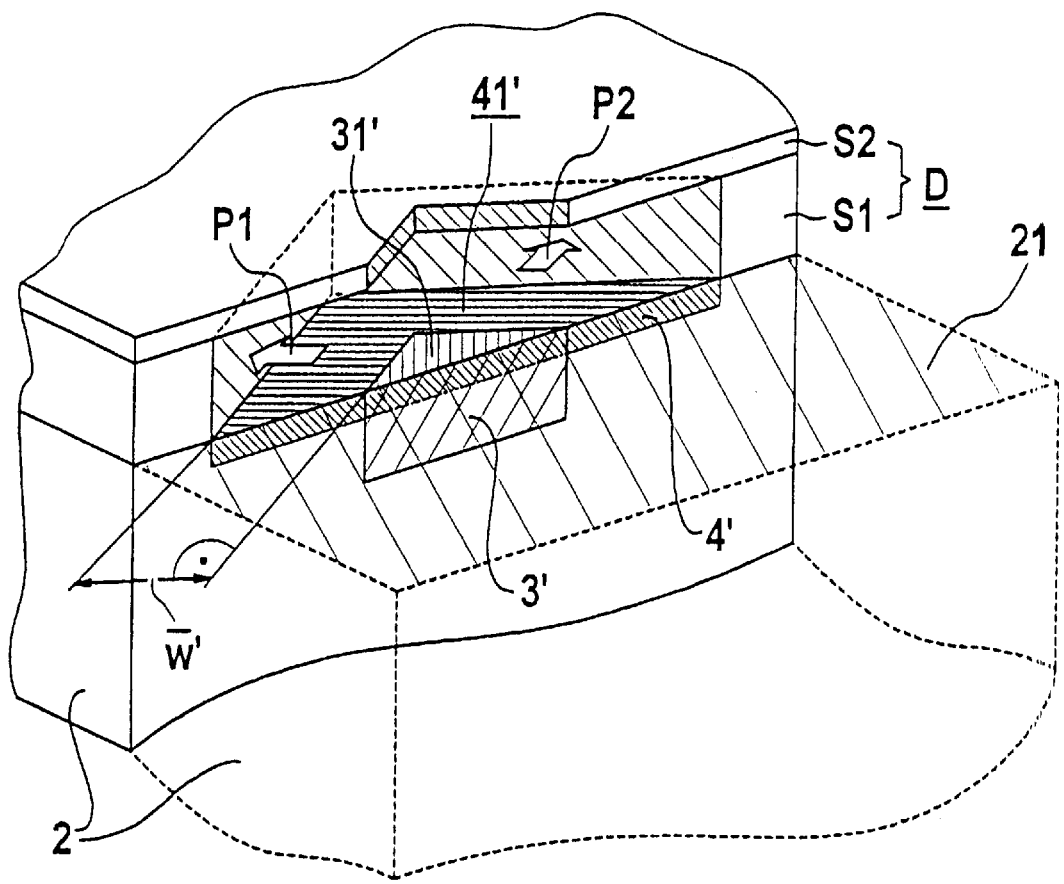
FIG. 3 is a partial, perspective view of a cross section through a semiconductor structure that has been processed by a method according to the invention, illustrating the undercutting process for drawing back the edge of a window according to the invention.

As illustrated in FIG. 3, a removal of at least one partial layer of the thin-film system D takes place only in the layer plane of the thin-film system D and is indicated by short arrows P1 and P2. The inner area 310' of the window 31' in the thin-film system D is set back approximately uniformly by an amount w' through the use of the undercutting process. The, in this way, at least one enlarged window 41' in the thin-film system D is utilized as a masking for a selective processing of a second semiconductor partial region 4' of the semiconductor region 2. As a result of the uniform undercutting of the thin-film system D on all sides, the semiconductor partial regions 3' and 4' are aligned with one another within the scope of an accuracy of the undercutting process without an additional masking plane on the semiconductor region 2; in particular, they are also centered with respect to one another. Optionally, there may also follow a high-temperature step for annealing or activating the selectively processed semiconductor partial regions. If necessary, the thin-film system D is removed beforehand for this purpose.

Finally, the semiconductor structure must also be provided, in a manner known per se, with auxiliary layers and electrodes for a contact-connection. For the example of a MOSFET structure, this means that the gate insulator and gate electrode have to be applied and patterned. In a final step, source and drain contacts also have to be metalized. The gate electrode and the source contact are aligned through the use of the mask defined by the thin-film system, but are preferably aligned, independently of the thin-film system, directly with an optical alignment marker which marks the position of the first partial region 3' of the semiconductor region 2.

In a further advantageous embodiment of the method according to the invention, the thin-film system includes at least a first thin film S1 and a second thin film S2, where the two thin films are deposited successively onto the surface of the semiconductor region to be patterned or structured and, on account of their material properties, can be etched selectively both relative to one another and with respect to the semiconductor material. This means that, for the thin-film system, an undercutting method can be specified in which just a first one of the at least two thin films is attacked, but not the second and/or further layers of the thin-film system or the semiconductor. By virtue of this selective etching capability, with a suitable selection of the order of the layers, only one layer is attacked by the undercutting process according to the invention. As a result of the masking of the first, etchable layer S1 by a second or further, non-etchable layers, the first layer S1 offers attack areas for the undercutting process. These attack areas of the first layer S1 are in each case perpendicular to the layer plane of the thin-film system D and are provided only within the at least one window 31' that has been etched in beforehand. The attack areas constitute a partial region, defined by the etchable layer S1, of the inner area 310' of the etched-in window 31'. The selectively etchable first layer S1 of the thin-film system D is preferably composed of silicon dioxide $SiO_2$, and a second layer S2 of the thin-film system D is preferably composed of polysilicon or low-stress $Si_3N_4$. The undercutting process is preferably carried out through the use of a wet-chemical etching method, a predetermined desired value of the undercutting depth being set by way of the etching duration. Buffered hydrofluoric acid (BHF) is preferably used as a wet-chemical etchant; however, other substances can also readily be used provided that they ensure a selective etchability of the thin-film system.

Figure 4:
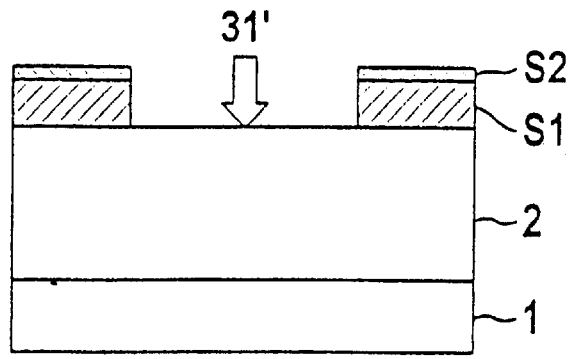
FIGS. 4 to 12 are diagrammatic cross-sectional views of a semiconductor structure illustrating the progression of a method according to the invention, where.
Figure 6:
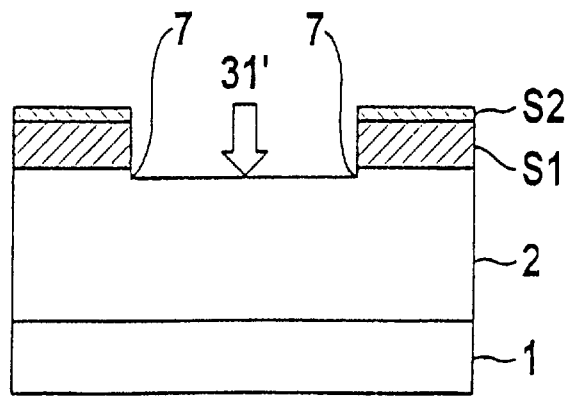

In an advantageous mode of the method according to the invention, after the opening of the at least one window 31' in the thin-film system in accordance with FIG. 4 and before a first selective processing step of a semiconductor region defined by the at least one window 31' in the thin-film system, indestructible etching edges 7 are additionally etched into the surface of the semiconductor region 2 in the area of the at least one window 31' in accordance with FIG. 6. It is then possible to effect an alignment with these etching edges in subsequent method steps, if, by way of example, as in the case of silicon carbide, the thin-film system must be removed before a high-temperature step for the purpose of annealing the processed semiconductor partial regions. A typical etching depth is approximately 300 nm.

Figure 5:
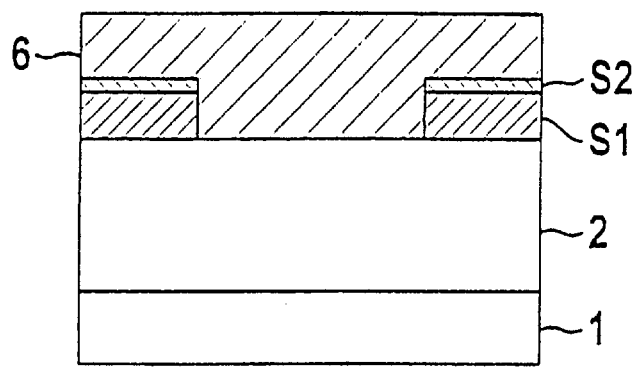

In a particularly advantageous embodiment, before the alignment markers are etched in, parts of the semiconductor region 2 that has been uncovered by the at least one window 31' are masked by the application of a further auxiliary layer 6 in accordance with FIG. 5, with the result that they are protected against an etching attack when the alignment markers are subsequently etched in. This masking is preferably performed through the use of a resist mask into which cutouts are introduced photolithographically. The cutouts uncover the thin-film system in those areas within which a window 31' for the etching in of an alignment marker is respectively situated.

Figure 7:
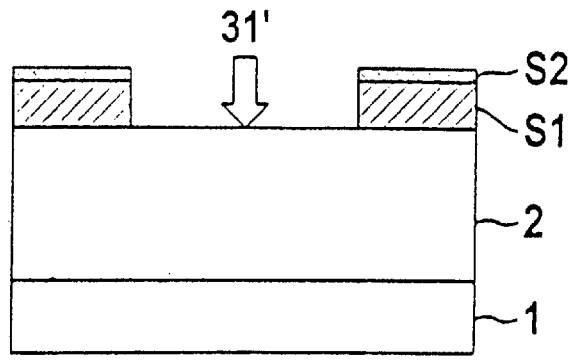
Figure 8:
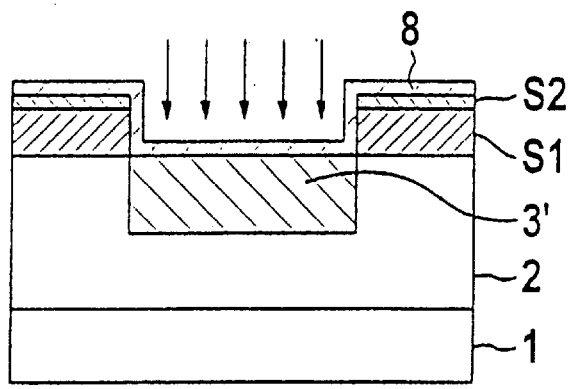
Figure 9:
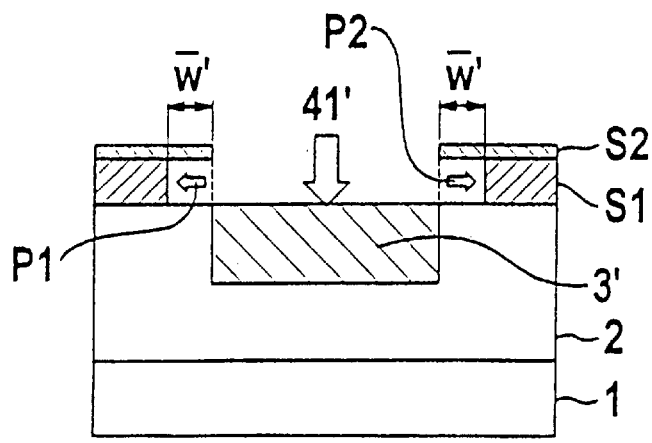
Figure 10:
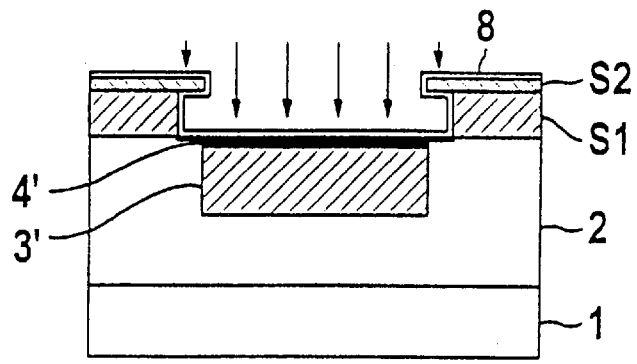

FIGS. 7 to 12 show a two-dimensional cross section through a semiconductor processed by the method according to the invention. On its surface, a semiconductor region 2 disposed on a substrate 1 has a first thin film S1 and a second thin film S2, which have been deposited successively onto the semiconductor region 2. After the opening of the window 31' in the thin-film system, as shown in FIG. 7, it is possible, in an advantageous embodiment of the method according to the invention, to optionally provide a screen layer 8 which is deposited onto the surface of the structure to be processed, as is indicated in FIG. 8. The screen layer can be used to influence, in a desired manner, the result of a selective processing of the first semiconductor partial region 3' defined by the at least one window 31'. If the properties of the first semiconductor partial region are intended to be altered by ion implantation, for example, then a screen layer 8 ensures that the impurity atoms are implanted as near as possible to the semiconductor surface. The material for the screen layer is preferably selected such that the screen layer is completely removed again during a subsequent undercutting process in accordance with FIG. 9 of the method according to the invention. The use of silicon dioxide ($SiO_2$)

for the screen layer 8 is particularly advantageous. It is possible, as shown in FIG. 10, optionally for a screen layer to be applied before each further selective processing step of the semiconductor region.

Figure 11:
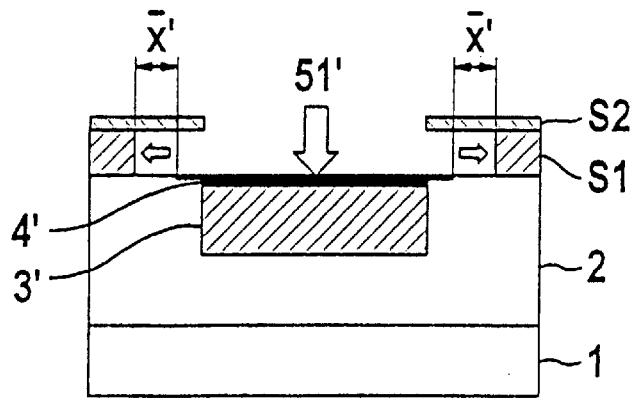
Figure 12:
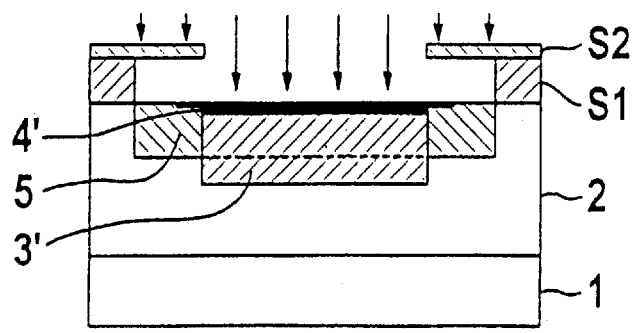

FIGS. 11 and 12 show a further advantageous embodiment of the method according to the invention. A second selective processing step of a second semiconductor region 4' of the semiconductor region 2 may also be followed by further processing steps. FIG. 11 illustrates a second undercutting process of the thin-film system. In this further undercutting process, the edges of the at least one window 41' (cf. FIG. 9) are drawn back by a further amount $\bar{x}'$ at least in a partial layer S1 of the thin-film system. The resulting at least one enlarged window 51 then serves, in accordance with FIG. 12, as masking for a third selective processing of a partial region 5 of the semiconductor region 2.

It is preferable for the at least one window 31' (cf. FIG. 7) that is etched into the thin-film system D to be at least approximately rectangular, hexagonal, triangular or circular. It is preferable also for the thicknesses of the thin films S1, S2 in the thin-film system D to be coordinated with one another. On the one hand, the second thin film S2, which withstands the undercutting process, is sufficiently thin to be able to perform a selective processing of the first semiconductor region 2 even through the roof-like projection in the thin-film system D resulting from the undercutting of the first thin film S1. On the other hand, the second thin film S2 must be thick enough to remain mechanically stable. Its mechanical stability also determines the maximum permissible undercutting. The thickness of the first thin film S1 is selected according to the stipulation that it forms, together with the layer S2, a sufficiently thick masking of the semiconductor region 2 for the selective processing steps to be carried out. Thicknesses of between 0.5 μm and a maximum of 3 μm are typically necessary for this.

In a particularly advantageous embodiment, a selective processing step of the first semiconductor region can be controlled in a particular manner by varying the thicknesses of the thin films S1, S2. Given the use of a window in the thin-film system which has the described structure of a projecting roof, two different partial regions of the first semiconductor region are defined, which can thus be processed solely by varying the layer thicknesses independently of one another in a single selective processing step. Of course it is also possible, however, to remove the undercut parts of the second thin film S2 after an undercutting process and before a selective processing of the semiconductor region.

The selected example of a vertical MOSFET structure serves merely for elucidating the invention and should not be understood as a restriction of the method to this structure. Of course the method is also suitable for fabricating other semiconductor structures, in particular for fabricating those structures in which the alignment of semiconductor partial regions relative to one another is critical for properties of the resulting component, and, in particular, when it matters that the semiconductor partial regions are centered with respect to one another.

The method according to the invention is particularly advantageous for the processing of semiconductor structures made of silicon carbide, since known methods, which are based on the different diffusivity of impurity atoms, are not suitable. However, it can also be applied to silicon and, in contrast to methods based on diffusion processes, affords the possibility of setting abrupt doping profiles in a semiconductor structure.

Figure 13:
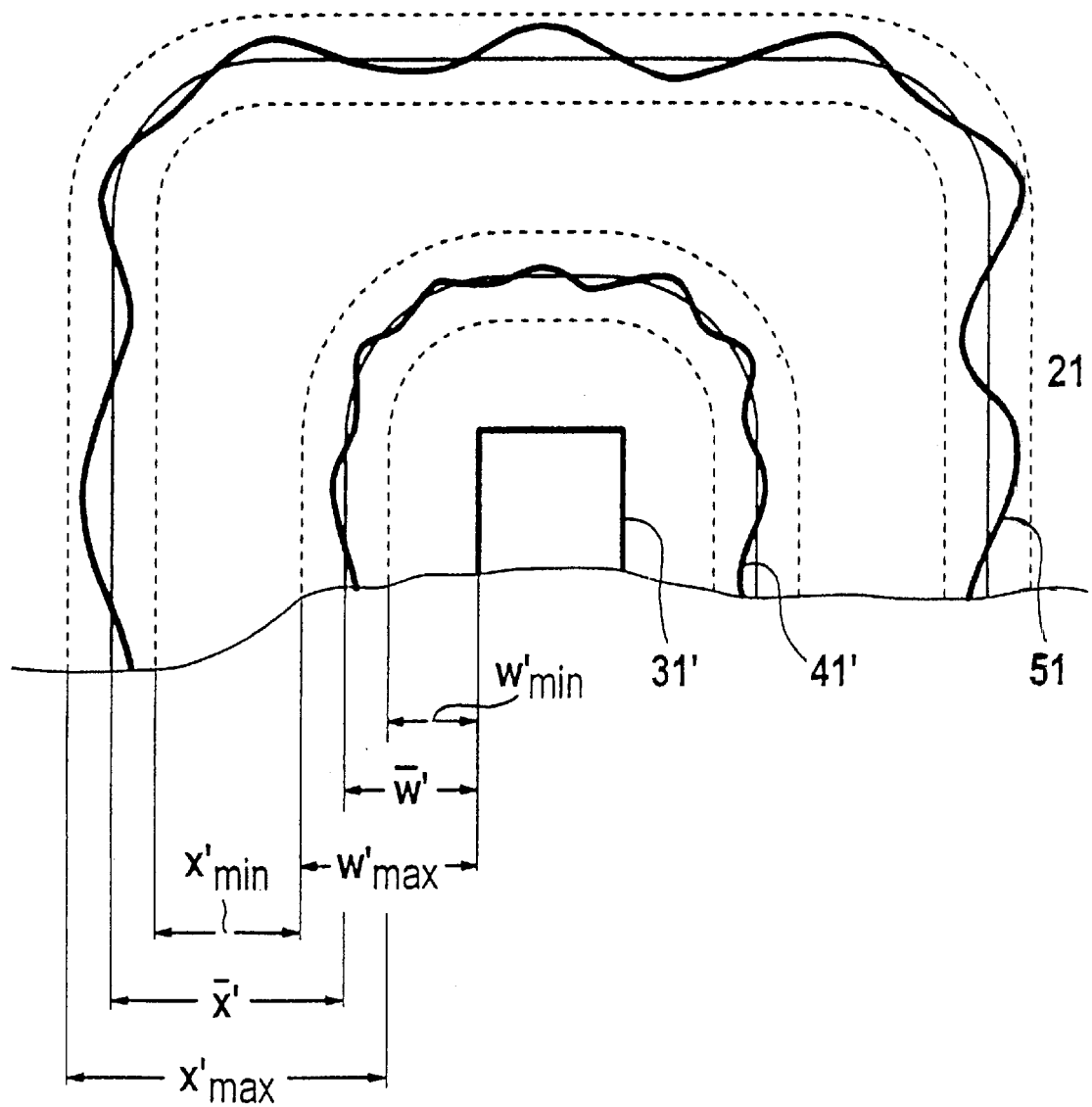

The particular advantages of the method according to the invention can be illustrated with reference to FIGS. 13 and 14. In a plan view of the surface 21 of the semiconductor region 2, one window, or if seen as a successive process, two different windows, are sketched here. The windows are used as a masking for successive, selective processing steps of the semiconductor region 2. FIG. 13 shows a window 31' in the thin-film system D, which is expanded to the windows 41' and 51, respectively, through the use of successive undercutting according to the invention. The respective edges of the window 41' and 51 which are indicated by a wavy line vary along the window edge between a minimum undercutting depth $w'_{min}$ and $x'_{min}$, respectively, and a maximum undercutting depth $w'_{max}$ and $x'_{max}$, respectively. In an advantageous embodiment, the undercutting process is carried out uniformly within the scope of an accuracy of 10 nm, with the result that, after the n-th undercutting step, the actual undercutting depth within the window etched by the n-th step deviates by not more than (n×10) nm from a mean undercutting depth $$\overline{w'} = \frac{w'_{max} + w'_{min}}{2}$$

and $$\overline{x'} = \frac{x'_{max} + x'_{min}}{2},$$

respectively.

FIG. 14 shows that the mean undercutting depths $\overline{w'}$, $\overline{w''}$, ... in m windows 41', 41", ... which are undercut parallel to one another deviate in each case by not more than 10 nm from an arithmetic mean value $\overline{w} = 1/m \cdot (\overline{w'} + \overline{w''} + ...)$ which is formed from the mean undercutting depths and is common to all of the windows.

It is particularly advantageous that it is possible to adjust the arithmetic mean $\overline{w}$ of the mean undercutting depths $\overline{w'}$, $\overline{w''}$, ... of all the windows, within a precision of 100 nm, to a predetermined desired value.

In FIG. 14, furthermore, a second etched-in window in the thin-film system is designated by the reference numeral 31", the minimum and maximum undercutting depths in the case of the first undercutting of a second window are designated by the symbols $w''_{min}$ and $w''_{max}$, and the deviations in the case of the first and second windows from the mean value of the mean undercutting depths are designated by the symbols $\Delta\overline{w'}$ and $\Delta\overline{w''}$.

The above-described method according to the invention can be used particularly advantageously for SiC material. In principle, however, it is also possible to provide other semiconductor materials (cf. "Landolt-Börnstein: Zahlenwerte und Funktionen aus Naturwissenschaft und Technik", [Landolt-Börnstein: Numerical values and functions from natural sciences and technology], new series, group III: *crystal and solid state physics*, Vol. 22: "Halbleiter" [Semiconductors], subvolume a, ed.: O. Madelung, Springer-Verlag Berlin (DE) etc., 1987, ISBN 3-540-16609-2, pages VIII to XII (Table of contents)). Examples for the above-mentioned materials would be gallium nitride (GaN) or gallium arsenide (GaAs) of the III-V compound type, silicon (Si) or diamond (C) of the IV-IV-type, zinc sulfide (ZnS) or cadmium selenide (CdSe) of the II-VI compound type. Mixed types such as $GaIn_xAs_yP_z$ are also suitable.

We claim:

1. A method for fabricating semiconductor structures, the method which comprises:

depositing a thin-film system onto a surface of a semiconductor region, the thin-film system including a partial layer formed of an oxide material and directly adjoining the surface of the semiconductor region;

etching a window into the thin-film system with an etching method, the window extending to the surface of the semiconductor region;

using the window in the thin-film system for a first selective processing of a partial region of the semiconductor region;

using an undercutting process for enlarging the window by moving back, in the partial layer, an edge of the window approximately uniformly by an amount corresponding to a mean undercutting depth in a plane of the partial layer; and subsequently utilizing the window for a second selective processing of a further partial region of the semiconductor region.

2. The method according to claim 1, which comprises successively depositing a first thin film as the partial layer and depositing a second thin film for forming the thin-film system, each of the first and second thin films having a respective material property and being selectively etchable with respect to at least one of the semiconductor region and a respective other one of the first and second thin films, such that at least one of the semiconductor region and the respective other one of the first and second thin films is not attacked.

3. The method according to claim 1, which comprises:

using a wet-chemical etching step for the undercutting process; and setting a desired value of an undercutting depth by an etching duration.

4. The method according to claim 3, which comprises using a buffered hydrofluoric acid as a wet-chemical etchant.

5. The method according to claim 1, wherein the step of etching the window into the thin-film system with the etching method includes removing material essentially in a preferred direction, the preferred direction having a given angle of inclination with respect to a line being normal to the surface of the semiconductor region.

6. The method according to claim 1, which comprises, subsequent to the step of etching the window into the thin-film system, additionally etching optically identifiable etching edges into the surface of the semiconductor region, the etching etches being resistant to an annealing of the semiconductor region.

7. The method according claim 1, which comprises, prior to a processing of the semiconductor region, applying a screen layer at least to parts of the surface of the semiconductor region.

8. The method according to claim 7, which comprises using $SiO_2$ for the screen layer.

9. The method according to claim 1, which comprises:

providing the partial layer as a first thin-film and providing a second thin film in the thin film system; and at least partially removing the second thin film after using the undercutting process for enlarging the window.

10. The method according to claim 1, which comprises:

providing the mean undercutting depth as an arithmetic mean value formed from a minimum undercutting depth and a maximum undercutting depth; and providing the window with an actual undercutting depth having a deviation from the mean undercutting depth, the deviation from the mean undercutting depth being smaller than a given value predetermined jointly for a plurality of windows.

11. The method according to claim 1, which comprises:

using the etching step for etching a plurality of windows and using the undercutting process for enlarging the plurality of windows;

keeping a mean value for the plurality of windows, the mean value for the plurality of windows corresponding to an arithmetic mean value formed from mean undercutting depths of the plurality of windows; and keeping deviations of the mean undercutting depths from the mean value for the plurality of windows below a given value.

12. The method according to claim 11, which comprises keeping a deviation of the mean value for the plurality of windows from a desired value at most equal to a linear dimensional value corresponding to an alignment tolerance.

13. The method according to claim 10, which comprises keeping the deviation of the actual undercutting depth from the mean undercutting depth at less than 10 nm.

14. The method according to claim 11, which comprises keeping the deviations of the mean undercutting depths from the mean value for the plurality of windows smaller than 10 nm for each of the plurality of windows.

15. The method according to claim 11, which comprises keeping a deviation of the mean value for the plurality of windows from a given desired value of an undercutting depth at less than 100 nm.

16. The method according to claim 1, which comprises introducing impurity atoms in the semiconductor region with an ion implantation for at least one of the first selective processing and the second selective processing.

17. The method according to claim 1, which comprises using a sequence of successive method steps, each of the method steps including at least an undercutting of the thin-film system for enlarging the window and subsequently using the windows in a masking of the semiconductor region for a selective processing of the semiconductor region.

18. The method according to claim 1, which comprises using an element selected from the group consisting of silicon carbide, gallium nitride, gallium arsenide, diamond and silicon for the semiconductor region.

19. A semiconductor structure, comprising:

a semiconductor material including a semiconductor region having a surface, a first partial region, and a second partial region;

a thin-film system disposed on said surface of said semiconductor region, said thin-film system including a partial layer formed of an oxide material directly adjoining said surface of said semiconductor region;

said thin-film system being formed with a window extending to said surface of said semiconductor region for allowing said first partial region to be processed by a first selective processing; and said thin film system being formed with an undercut in said partial layer for allowing said second partial region to be processed by a second selective processing.

* * * * *